United States Patent [19]

Katsuta et al.

[11] 4,363,953
[45] Dec. 14, 1982

[54] ELECTRON BEAM SCRIBING METHOD

[75] Inventors: Teiji Katsuta; Koji Nishiwaki; Shinjiro Katagiri, all of Ibaraki, Japan

[73] Assignee: Hitachi, Ltd., Tokyo, Japan

[21] Appl. No.: 145,742

[22] Filed: May 1, 1980

[30] Foreign Application Priority Data

May 4, 1979 [JP] Japan .................................. 54-54192

[51] Int. Cl.³ .............................................. B23K 15/00
[52] U.S. Cl. ....................... 219/121 EK; 219/121 ER; 219/121 EV; 219/121 EW; 250/492.2
[58] Field of Search ................... 219/121 EB, 121 EJ, 219/121 EK, 121 EM, 121 ER, 121 ES, 121 EV, 121 EX, 121 EY, 121 LP, 121 LW; 250/492.2

[56] References Cited

U.S. PATENT DOCUMENTS

| 3,436,510 | 4/1969 | Fyler | 219/121 EJ X |
| 3,659,510 | 5/1972 | Garvin et al. | 219/121 LP X |
| 3,857,041 | 12/1974 | Spicer | 219/121 EV X |
| 3,894,271 | 7/1975 | Pfeiffer et al. | 219/121 EX X |
| 3,900,737 | 8/1975 | Collier et al. | 219/121 EV X |
| 4,051,381 | 9/1977 | Trotel | 250/492 A |
| 4,145,597 | 3/1979 | Yasuda | 219/121 ES |
| 4,151,422 | 4/1979 | Goto et al. | 250/492 A |
| 4,243,866 | 1/1981 | Pfeiffer et al. | 219/121 EJ X |

FOREIGN PATENT DOCUMENTS 1268285 5/1968 Fed. Rep. of Germany ...... 219/121 EB

Primary Examiner—G. Z. Rubinson
Assistant Examiner—Keith E. George
Attorney, Agent, or Firm—Antonelli, Terry & Wands

[57] ABSTRACT

A plurality of band-shaped regions on a specimen are successively scanned by an electron beam having a ribbon-shaped rectangular cross-section. This scanning is effected by deflecting the electron beam electrostatically in the direction of the shorter side of the beam cross-section and electromagnetically in the direction of the longer side of the beam cross-section.

2 Claims, 4 Drawing Figures

ELECTRON BEAM SCRIBING METHOD

BACKGROUND OF THE INVENTION (1) Field of the Invention

The present invention relates to an electron beam scribing method for scribing a desired pattern on a specimen.

(2) Description of the Prior Art

The most commonly used electron beam scanning method is the so-called spot beam scanning method in which desired patterns are scribed on a specimen by scanning the latter with a spot electron beam. This scribing method, however, involves a problem that a considerably long time is required for the scribing when compared with other techniques. However, it is very suitably used for scribing fine or minute patterns.

Another known electron beam scanning method is the so-called area scribing method or flash scribing method in which the pattern is scribed by a scanning of the specimen with a square electron beam of a size which is variable and several to several tens times as large as the spot beam, in such a manner as to place a stamp successively. This method can considerably eliminate the above-mentioned problem of the spot beam scanning method. Unfortunately, however, this method requires input data such as a coordinate signal representing the position of each flash, the size of each flash and so forth. As a result, a long time is required for the inputting, setting and transfer of the large amount of input data.

SUMMARY OF THE INVENTION

It is, therefore, an object of the invention to provide an electron beam scribing method which can effectively shorten the time required for the scribing.

It is another object of the invention to provide an electron beam scribing method effective for reducing the amount of data required for the scribing.

To these ends, according to the invention, an electron beam having a ribbon-shaped cross-section is directed toward the specimen and is deflected such that the it is directed successively to band-like regions on the specimen. The band-shaped regions are successively scanned by the electron beam to repeat the deflecting of the beam in the direction of the longer side of the ribbon-shaped cross-section thereof, and during each such successive scan the beam is deflected in the direction of the shorter side of the cross-section within each of the band-shaped regions with the direction of the longer side materially coinciding with the longitudinal direction of the band-shaped regions.

These and other objects, as well as advantageous features of the invention will become clear from the following description of the preferred embodiments taken in conjunction with the accompanying drawings.

DESCRIPTION OF THE PREFERRED EMBODIMENTS

Figure 1:
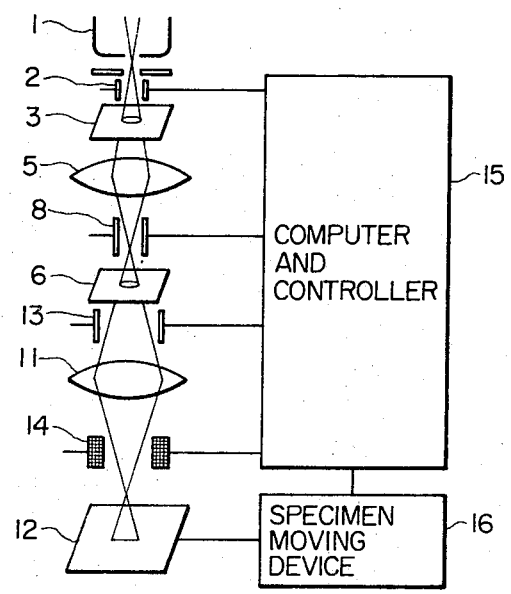
FIG. 1 illustrates the concept of an embodiment of the invention, for explaining the method of the invention.

Referring to FIG. 1 illustrating an embodiment of the invention, an electron beam discharged from an electron gun 1 is projected to a shaping orifice 3, through a deflector 2 for blanking purposes. The shaping orifice 3 has a circular orifice hole so that the electron beam passing therethrough is shaped to have a circular cross-section. This shaped electron beam is projected through an electromagnetic projector lens 5 to a shaping orifice such that an image of the circular orifice bore is formed on the shaping orifice 6. The shaping orifice 6 has a ribbon-shaped orifice bore, so that the electron beam having passed this shaping orifice 6 has a ribbon-shaped rectangular cross-section. An electrostatic type deflector 8 is disposed between projector electron lens 5 and the shaping orifice 6, so that the electron beam coming into the shaping orifice 6 is deflected in the longitudinal direction of the ribbon-shaped orifice bore, i.e. in the direction of the longer side of the latter. It is, therefore, possible to obtain an electron beam of a ribbon-shaped rectangular cross-section the length of which can varied in accordance with the operation of the deflector 8. The electron beam thus formed having a ribbon-shaped rectangular cross-section is projected to a specimen 12 by means of an electromagnetic lens 11 such that an image of the ribbon-shaped orifice bore is formed on the specimen 12. An electrostatic type deflector 13 is disposed between the shaping orifice 6 and the objective lens 11. Also, an electromagnetic deflector 14 is interposed between the objective lens 11 and the specimen 12.

Figure 2:
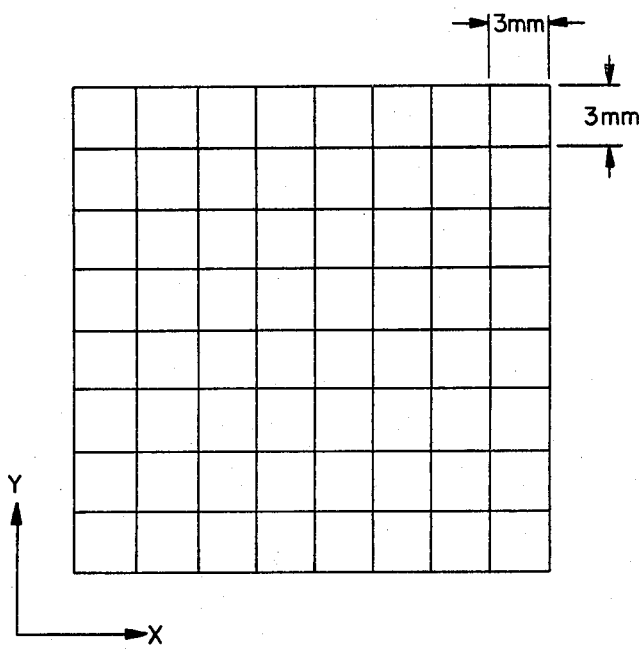
FIG. 2 is an enlarged view of the surface of a specimen shown in FIG. 1.
Figure 3:
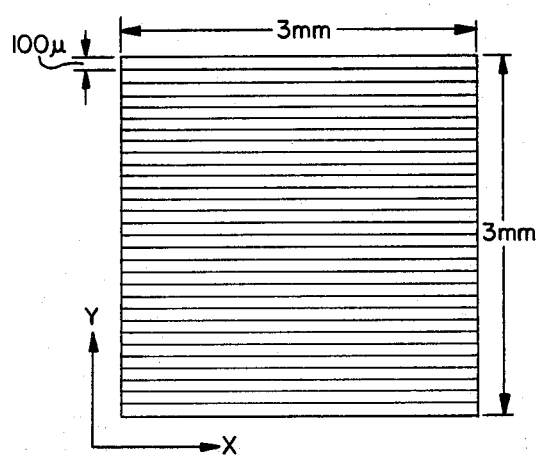
FIG. 3 is an enlarged view showing band-shaped imaginary regions within any one of matrix-like imaginary regions illustrated in FIG. 2.

The surface of the specimen 12 is assumed to be divided into matrix-like imaginary regions each of which has an area of, for example, 3 mm × 3 mm, as illustrated in FIG. 2. Further, it is assumed that each of the matrix-like imaginary regions is divided into band-shaped imaginary regions each of which has a length of 3 mm in the X-direction and length of 100μ in the Y-direction perpendicular to the X-directiion, as illustrated in FIG. 3, and that each of the band-shaped imaginary regions is sub-divided into fine imaginary regions each of which has a length of 5μ in the X-direction and length of 100μ in the Y-direction, as illustrated in FIG. 4.

Figure 4:
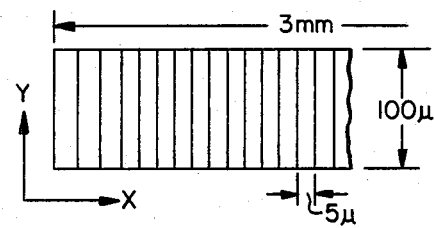
FIG. 4 is an enlarged view of a part of any one of band-shaped imaginary regions illustrated in FIG. 3.

In the scribing, at first one of the fine imaginary regions shown in FIG. 4 is scanned by the electron beam having the ribbon-shaped rectangular cross-section. This scanning is achieved by continuously deflecting the electron beam having the ribbon-shaped rectangular cross-section within the fine imaginary region in the Y-direction, i.e. in the direction of the shorter side of the cross-section of the beam, while maintaining the lengthwise direction, i.e. the direction of longer side of the ribbon-shaped rectangular cross-section coinciding with the X-direction. In this case, it is assumed here that the ribbon-shaped rectangular cross-section of the electron beam has a length of 5μ and width of 0.25μ. To achieve a high-speed scribing, this deflection in the Y-direction is effected by the electrostatic deflector 13. Therefore, the deflection in the Y-direction can be completed in quite a short period of several tens of microseconds. Needless to say, it is necessary to reduce the length of the ribbon-shaped rectangular cross-section of the electron beam or to make a blanking of the electron beam, in accordance with the pattern to be scribed, during the deflection in the Y-direction.

After the completion of scanning of a fine imaginary region as described above, the electron beam is deflected in the X-direction in a stepped manner by 5μ at each time to effect the scanning of the next fine imaginary region. This operation is repeated over all of the fine imaginary regions of the specimen 12 located within the region of 3 mm in the X-direction. In consequence, the scanning over a band-shaped region of 100μ×3 mm is completed.

When there is a fine imaginary region in which the scribing should not be effected, the scanning is of course not effected on such a fine imaginary region. Namely, such a region is skipped over. The scanning in the X-direction for shifting from one to the next fine imaginary region is effected by means of the electromagnetic deflector 14. This is because the scanning in the X-direction need not be conducted at such a high speed as the scanning in the Y-direction for the fine imaginary region, and that the deflection by electromagnetic deflector causes a smaller distortion as compared with the deflection by electrostatic deflector. The range of the electromagnetic deflection in the X-direction is limited to be 3 mm, because the distortion of deflection is negligibly small within such a range. On the other hand, an innegligibly large deflection distortion is generally caused by an electrostatic distortion, when the range of deflection exceeds about 100μ.

After the completion of the above-described scanning of a band-shaped region, the electron beam of ribbon-like rectangular cross-section is deflected in the Y-direction by 100μ, by the electromagnetic deflector 14 to position the beam in the next band-shaped region, and the scanning is effected in the same manner as that described before. Similarly, the ribbon-shaped rectangular electron beam is deflected successively in the Y-direction by 100μ after each completion of 3 mm scanning in X-direction. This scanning in the Y-direction is made within the range of 3 mm.

As this process is repeated, a scanning is completed over a matrix-like region of 3 mm×3 mm as shown in FIG. 2. Then, the same process is repeated to scan the remaining matrix-like regions.

In consequence, the scanning is made over the entire surface of the specimen 12, so that the predetermined pattern is scribed on the latter.

The shifting of scanning from one to the next 3 mm×3 mm matrix-like region is achieved by shifting the specimen 12 two-dimensionally by a shifting mechanism 16 or the like.

It is essential that the scribing is made strictly in accordance with the predetermined pattern. Therefore, in the actual scribing process, it is necessary to effect a blanking of the electron beam by the deflector 2 and/or to control the length of cross-section of the electron beam making use of the deflector 8. The control of blanking and the control of length of the ribbon-shaped rectangular cross-section of electron beam, as well as the deflection control effected by the deflectors 13 and 14 and also the control of shifting of the specimen by the specimen shifting mechanism 6, are effected by the cooperation of a computer and a controller 15.

It will be understood that, in the described embodiment of the invention, the scanning in the conventional spot electron beam scanning method in an X-direction corresponding to the length of the ribbon-shaped rectangular cross-section of the electron beam is eliminated, so that the scribing time is shortened as compared with the conventional spot beam scanning method. In addition, the input data necessitated in the conventional area scribing method for each flash section, such as position and size of the flash section, are not necessitated in the method of the invention. Namely, all that is required is to input to the computer the starting point of X-direction scanning of the band-shaped small region, the length of the ribbon-shaped rectangular cross-section of the electron beam, and the starting and finishing point of the scanning in Y-direction, as the input data.

Although the invention has been described through its preferred form, the described embodiment is not exclusive, and various changes and modifications are imparted to the described embodiment without departing from the scope of the invention which is limited solely by the appended claims.

What is claimed is:

1. A method of scribing a predetermined pattern on the surface of a specimen with an electron beam of a rectangular cross-section having a long side and a short side, the surface of the specimen being divided into matrix imaginary regions, each of said matrix imaginary regions being composed of band-shaped imaginary regions each of which has a long side and a short side, and each of the band-shaped imaginary regions being composed of a plurality of fine imaginary regions, comprising the steps of:
   (1) scanning each of predetermined ones of the band-shaped imaginary regions in each of predetermined ones of the matrix imaginary regions with the electron beam to electromagnetically deflect the same from one to another of predetermined ones of the fine imaginary regions in each of the predetermined band-shaped imaginary regions in a stepped manner in the direction of the long side of the rectangular cross-section of the electron beam and to electrostatically deflect the electron beam in each of the predetermined fine imaginary regions in the direction of the short side of the rectangular cross-section of the electron beam during periods between stepped deflections of the electron beam in the direction of the long side of the rectangular cross-section thereof, with the direction of the long side of the rectangular cross-section of the electron beam coinciding substantially with the direction of the long side of the band-shaped imaginary regions;
   (2) electromagnetically deflecting the electron beam to expose each of the predetermined band-shaped imaginary regions in each of the predetermined matrix imaginary regions to said electron beam in a stepped manner; and
   (3) two-dimensionally shifting the specimen to expose each of the predetermined matrix imaginary regions to the electron beam in a stepped manner.

2. A method as defined in claim 1, wherein the length of the long side of the rectangular cross-section of the electron beam is variable.

* * * * *